(12) United States Patent
Liu et al.

(10) Patent No.: US 10,109,729 B2
(45) Date of Patent: Oct. 23, 2018

(54) HIGH ELECTRON MOBILITY TRANSISTORS

(71) Applicant: Taiwan Semiconductor Manufacturing Co., Ltd., Hsin-Chu (TW)

(72) Inventors: Po-Chun Liu, Hsinchu (TW); Chung-Yi Yu, Hsin-Chu (TW); Chi-Ming Chen, Zhubei (TW); Chen-Hao Chiang, Jhongli (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/242,653

(22) Filed: Aug. 22, 2016

(65) Prior Publication Data

US 2016/0359034 A1 Dec. 8, 2016

Related U.S. Application Data

(63) Continuation of application No. 13/745,925, filed on Jan. 21, 2013, now Pat. No. 9,425,276.

(51) Int. Cl.
*H01L 29/15* (2006.01)
*H01L 31/0256* (2006.01)
(Continued)

(52) U.S. Cl.
CPC ...... *H01L 29/7787* (2013.01); *H01L 29/2003* (2013.01); *H01L 29/205* (2013.01);
(Continued)

(58) Field of Classification Search
CPC ............. H01L 29/432; H01L 29/66462; H01L 29/7783; H01L 29/201; H01L 29/2003; H01L 29/7787
See application file for complete search history.

(56) References Cited

U.S. PATENT DOCUMENTS 6,064,082 A * 5/2000 Kawai ................ H01L 29/7783
257/191
8,436,398 B2 5/2013 Lidow et al.
(Continued)

FOREIGN PATENT DOCUMENTS

CN 102365745 A 2/2012
CN 102881715 A 1/2013

OTHER PUBLICATIONS

Non-Final Office Action dated Sep. 29, 2014 for U.S. Appl. No. 13/745,925.
(Continued)

*Primary Examiner* — Fernando L Toledo
*Assistant Examiner* — Aaron Gray
(74) *Attorney, Agent, or Firm* — Eschweiler & Potashnik, LLC

(57) ABSTRACT

The present disclosure relates to a transistor device having a donor bi-layer configured to provide low-resistance to source and drain contacts while maintaining a high-mobility two-dimensional electron gas within a channel layer, and an associated method of formation. In some embodiments, the transistor device has a channel layer disposed over a substrate and a donor bi-layer disposed over the channel layer. The donor bi-layer includes a mobility-enhancing layer of $Al_zGa_{(1-z)}N$ disposed over the channel layer and having a first molar fraction z in a first range, and a resistance-reducing layer of $Al_xGa_{(1-x)}N$ disposed on and in contact with the mobility-enhancing layer of $Al_zGa_{(1-z)}N$ and having a second molar fraction x in a second range less than the first range. Source and drain contacts are over the resistance-reducing layer of $Al_xGa_{(1-x)}N$. The donor bi-layer has a conduction band energy that monotonically decreases from top to bottom surfaces of the donor bi-layer.

20 Claims, 13 Drawing Sheets

(51) Int. Cl.
*H01L 29/66* (2006.01)
*H01L 21/338* (2006.01)
*H01L 29/778* (2006.01)
*H01L 29/43* (2006.01)
*H01L 29/20* (2006.01)
*H01L 29/205* (2006.01)
*H01L 29/201* (2006.01)

(52) U.S. Cl.
CPC ...... *H01L 29/432* (2013.01); *H01L 29/66462* (2013.01); *H01L 29/7783* (2013.01); *H01L 29/201* (2013.01)

(56) References Cited

U.S. PATENT DOCUMENTS

| | | | |
|---|---|---|---|
| 2002/0167023 A1 | 11/2002 | Chavarkar et al. | |
| 2003/0218183 A1* | 11/2003 | Micovic | H01L 21/28575 257/192 |
| 2007/0045670 A1 | 3/2007 | Kuraguchi | |
| 2008/0197359 A1* | 8/2008 | Imanishi | H01L 21/02378 257/76 |
| 2009/0008678 A1* | 1/2009 | Ando | H01L 29/7787 257/194 |
| 2010/0258841 A1* | 10/2010 | Lidow | H01L 29/1066 257/192 |
| 2011/0272742 A1* | 11/2011 | Akiyama | H01L 21/324 257/194 |
| 2012/0126287 A1* | 5/2012 | Aoki | H01L 29/402 257/192 |

OTHER PUBLICATIONS

Final Office Action dated Apr. 14, 2015 for U.S. Appl. No. 13/745,925.
Non-Final Office Action dated Sep. 30, 2015 for U.S. Appl. No. 13/745,925.
Notice of Allowance dated Apr. 25, 2016 for U.S. Appl. No. 13/745,925.

* cited by examiner

300A

300B

300C

HIGH ELECTRON MOBILITY TRANSISTORS

REFERENCE TO RELATED APPLICATION

This Application is a Continuation of U.S. application Ser. No. 13/745,925 filed on Jan. 21, 2013, the contents of which is hereby incorporated by reference in its entirety.

BACKGROUND

High electron mobility transistors (HEMTs) are utilized in integrated circuits for high-frequency applications due to their high efficiency relative to other power semiconductor devices such as insulated gate bipolar transistors and thyristors. HEMTs utilize a heterojunction between two semiconducting materials with different band gaps to form a device channel, instead of a doped region as in a metal oxide semiconductor field-effect transistor (MOSFET). Two exemplary materials used to form the heterojunction within a HEMT are a doped wide-bandgap n-type donor layer of AlGaN coupled to an un-doped narrow-bandgap channel layer of GaN. Ohmic contacts formed to the AlGaN donor layer are subject to increased contact resistance as the Al concentration of the AlGaN donor is increased. Conversely, reducing the concentration of the AlGaN donor layer improves the contact resistance, but degrades electron mobility within the channel.

DETAILED DESCRIPTION

Figure 1A:
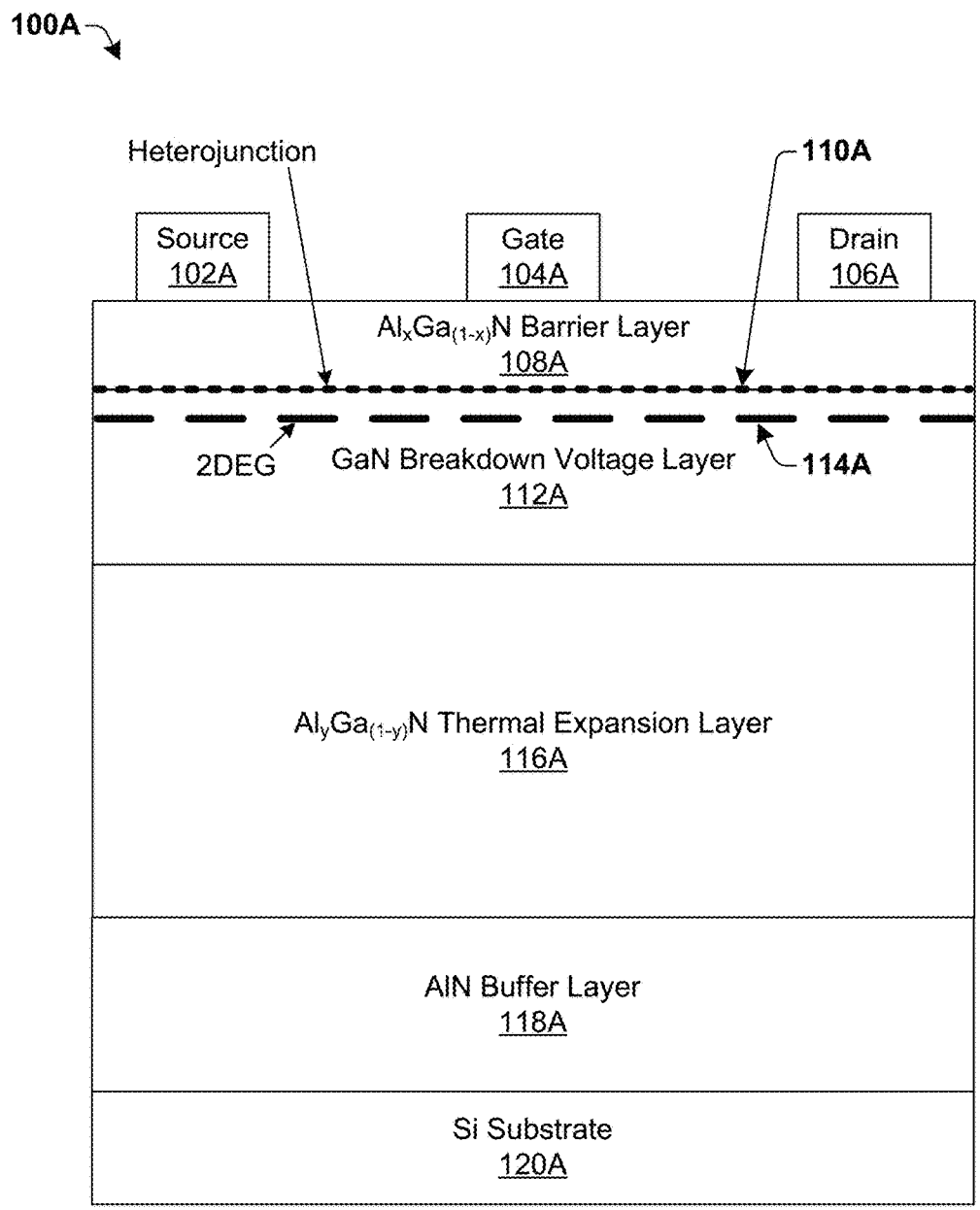
FIG. 1A illustrates a cross-sectional view of a transistor comprising a donor layer of $Al_xGa_{(1-x)}N$.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

FIG. 1A illustrates a cross-sectional view of a transistor 100A comprising a donor layer 108A of $Al_xGa_{(1-x)}N$ formed beneath a source contact 102A, a gate 104A, and a drain contact 106A. A heterojunction 110A is formed between the donor layer 108A and a channel layer 112A of GaN. Electrons generated from the donor layer 108A diffuse into the GaN channel layer 112A to form a high-mobility/high-concentration two-dimensional electron gas (2DEG) 114A, which forms a channel of the device within the channel layer 112A in a vicinity of the heterojunction 110A. A thermal expansion layer 116A of $Al_yGa_{(1-y)}N$ is disposed beneath the channel layer 112A, and an buffer layer 118A of AlN is disposed beneath the channel layer 112A and above a Si substrate 120A.

In at least one embodiment, the transistor 100A includes the channel layer 112A and the donor layer 108A having compounds made from the III-V groups in the periodic table of elements. However, the channel layer 112A and the donor layer 108A are different from each other in composition. The channel layer 112A is undoped or unintentionally doped (UID). The donor layer 108A is intentionally doped.

Figure 1B:
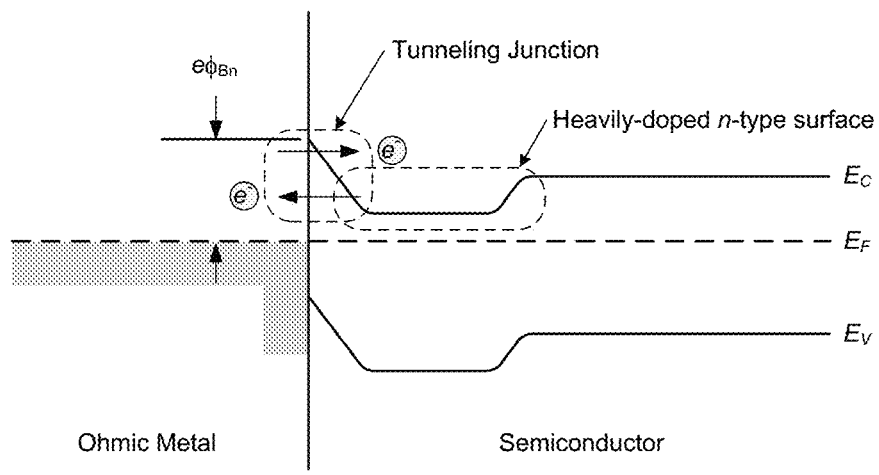
FIG. 1B illustrates an electron band structure of a heterojunction formed between an ohmic metal and a donor layer of $Al_xGa_{(1-x)}N$.

FIG. 1B illustrates an electron band structure 100B of a heterojunction formed between an ohmic metal and a semiconducting material comprising the donor layer 108A of $Al_xGa_{(1-x)}N$ of FIG. 1A. The semiconducting material comprises a bandgap of approximately equal to an energy of a conduction band $E_C$ minus the energy of a valence band $E_V$ of the semiconducting material (i.e., $E_C-E_V$), and is heavily doped with an n-type material near the surface, which lowers the energy of the conduction band $E_C$ relative to the Fermi level $E_F$, thus freeing electrons to tunnel from the ohmic metal to the conduction band $E_C$ of the semiconducting material. This influx of electrons to the conduction band $E_C$ of the semiconducting material, increasing electron concentration and overall electron mobility within the channel of the heterojunction.

The donor layer 108A of $Al_xGa_{(1-x)}N$ exhibits poor ohmic contact behavior resulting in an increased contact resistance for Al concentrations above approximately 25% (i.e., molar fraction x>0.25), which is induced by a large band gap of the donor layer 108A of $Al_xGa_{(1-x)}N$, and an alloy process for disposal of the source contact 102A and drain contact 106A over the donor layer 108A of $Al_xGa_{(1-x)}N$. Reducing the Al concentration below approximately 15% (i.e., molar fraction x<0.15) can improve the ohmic contact behavior by lowering the resistance, but degrades electron mobility within the 2DEG 114A.

Accordingly, the present disclosure relates to a donor layer of bi-layer AlGaN within a HEMT configured to provide low-resistance ohmic source and drain contacts to reduce power consumption, while maintaining a high-mobility of a 2DEG within a channel of the HEMT. The donor layer of bi-layer AlGaN comprises a mobility-enhancing layer of $Al_zGa_{(1-z)}N$, and a resistance-reducing layer of $Al_xGa_{(1-x)}N$ disposed over the mobility-enhancing layer, wherein the ohmic source and drain contacts connect to the HEMT. A channel layer is disposed beneath the mobility-enhancing layer, wherein a 2DEG resides, forming the channel of the HEMT.

Figure 2A:
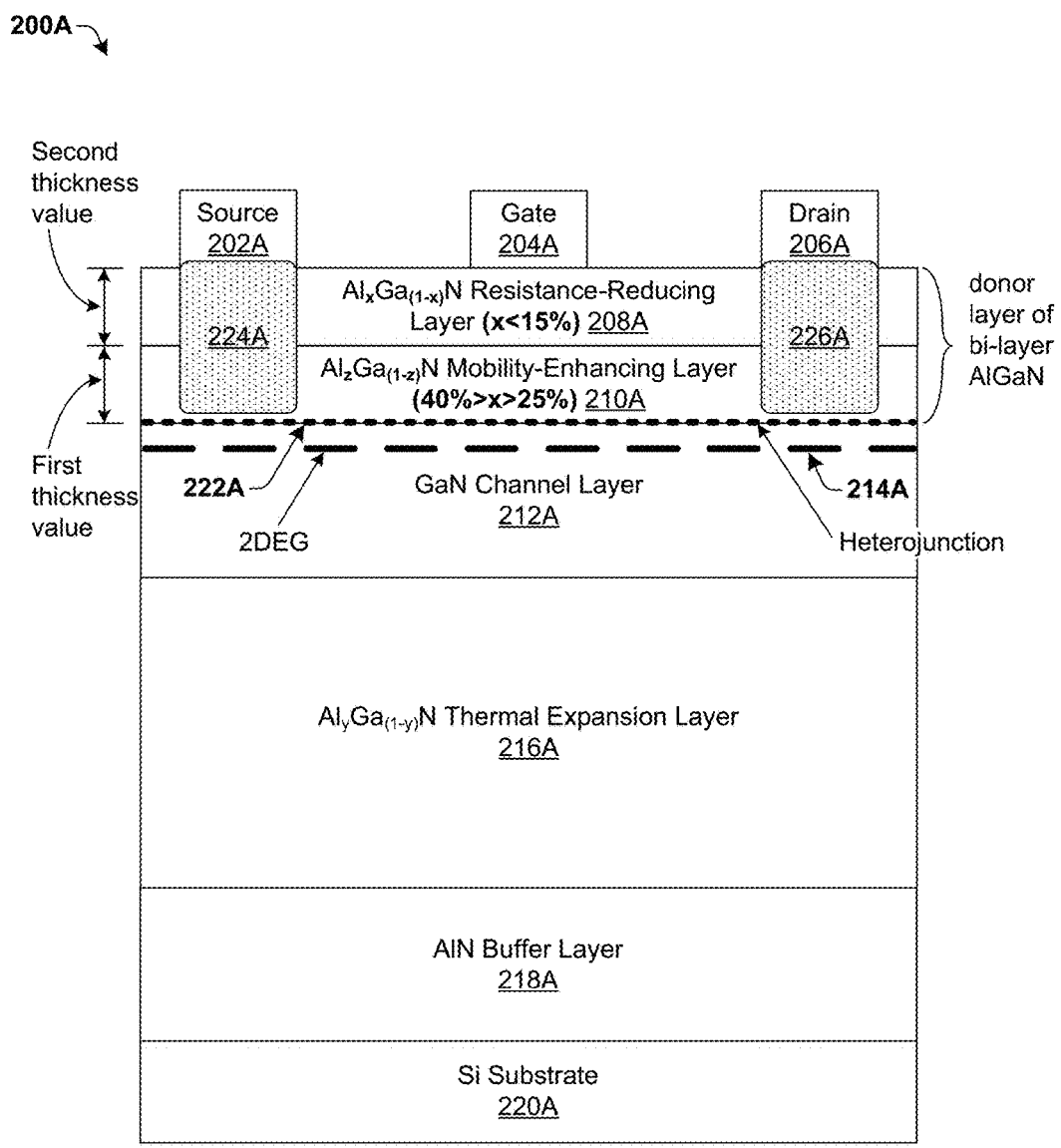
FIG. 2A illustrates a cross-sectional view of some embodiments of a transistor comprising a donor layer of bi-layer AlGaN further comprising a mobility-enhancing layer of $Al_zGa_{(1-z)}N$, and a resistance-reducing layer of $Al_xGa_{(1-x)}N$.

FIG. 2A illustrates a cross-sectional view of some embodiments of a transistor 200A comprising a donor layer of bi-layer AlGaN further comprising a mobility-enhancing layer 210A of $Al_zGa_{(1-z)}N$, wherein a third molar fraction z is less than approximately 0.4 and greater than approximately 0.25, and a resistance-reducing layer 208A of $Al_xGa_{(1-x)}N$ disposed over the mobility-enhancing layer 210A, wherein a first molar fraction x is less than approximately 0.15 and greater than approximately 0.1. The a donor layer of bi-layer AlGaN is formed beneath a source ohmic metal contact 202A connecting to the resistance-reducing layer 208A disposed over a source region 224A, a gate material 204A disposed above a channel region and connecting to the resistance-reducing layer 208A, and a drain ohmic metal contact 206A connecting to the resistance-reducing layer 208A disposed over a drain region 226A. In some embodiments, the source ohmic metal contact 202A and drain ohmic metal contact 206A comprise Ti/Al/Ti or Ti/Al/Ti/TiN, and the gate material 204A comprises TiN or WN. A heterojunction 222A is formed between the donor layer of bi-layer AlGaN and a channel layer 212A of GaN, wherein a 2DEG 214A resides, comprising a high-mobility channel of the transistor 200A.

The transistor 200A further comprises a HEMT, wherein the mobility-enhancing layer 210A comprises a first thickness value that is approximately twice a second thickness value of the resistance-reducing layer 208A. In some embodiments, the first thickness value is between approximately 20 nanometers and 40 nanometers, and the second thickness value is between approximately 10 nanometers and 20 nanometers. A thermal expansion layer 216A of $Al_yGa_{(1-y)}N$ is disposed beneath the channel layer 212A, wherein a second molar fraction y is less than approximately 1 and greater than approximately 0. A buffer layer 218A of AlN is disposed beneath the thermal expansion layer 216A, and above a Si substrate 220A.

Figure 2B:
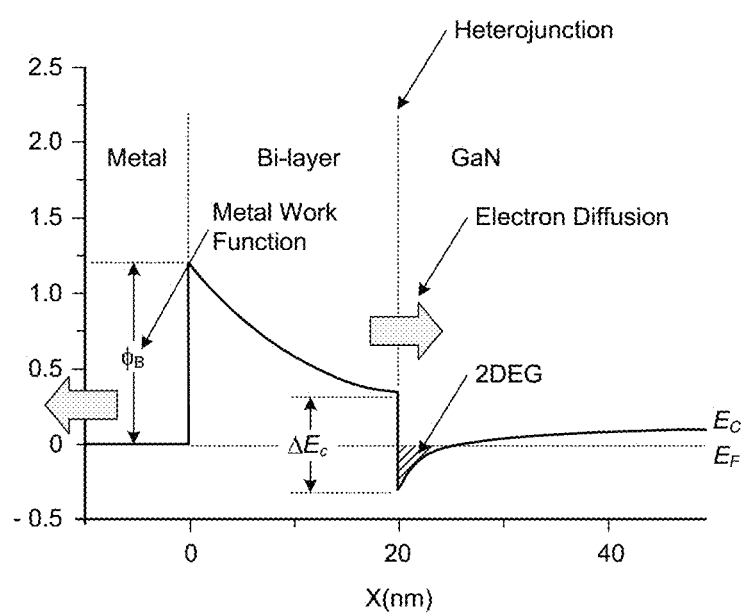
FIG. 2B illustrates some embodiments of an electron band structure of a heterojunction formed between a donor layer of bi-layer AlGaN and a channel layer of GaN.

FIG. 2B illustrates some embodiments of an electron band structure 200B of a heterojunction formed between the donor layer of bi-layer AlGaN of FIG. 2A and the channel layer 212A of GaN of FIG. 2A. Within the donor layer of bi-layer AlGaN, a concentration gradient between the mobility-enhancing layer of $Al_zGa_{(1-z)}N$ (0.4>z>0.25) and the resistance-reducing layer of $Al_xGa_{(1-x)}N$ (0.15>x>0.1) produces a conduction band ($E_C$) characteristic, wherein the energy of the conduction band decreases away from the ohmic metal and towards the channel layer of GaN. As a result, conduction electrons within the donor layer of bi-layer AlGaN diffuse into the channel layer 212A of GaN due to the conduction band ($E_C$) characteristic (e.g., electrons move to the lowest energy state). The electrons accumulate at a potential minimum of the conduction band ($E_C$), which dips below the Fermi level ($E_F$) at the heterojunction, trapping the electrons to form the 2DEG.

Figure 3A:
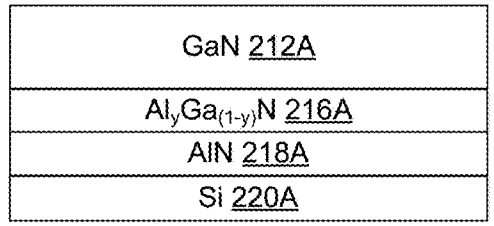
FIGS. 3A-3O illustrate cross-sectional views of some embodiments of a donor layer of bi-layer AlGaN fabrication within a transistor.
Figure 3B:
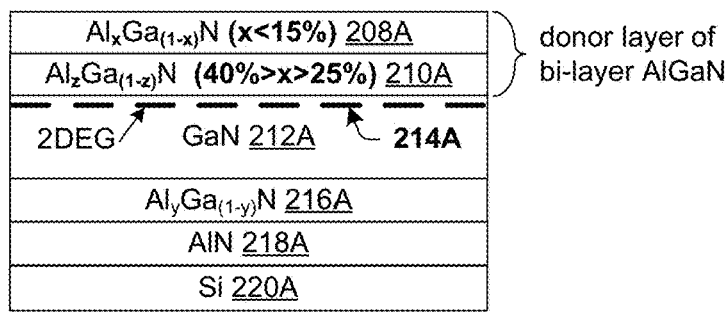
Figure 3C:
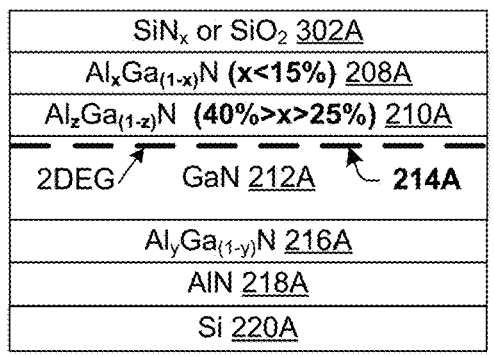
Figure 3D:
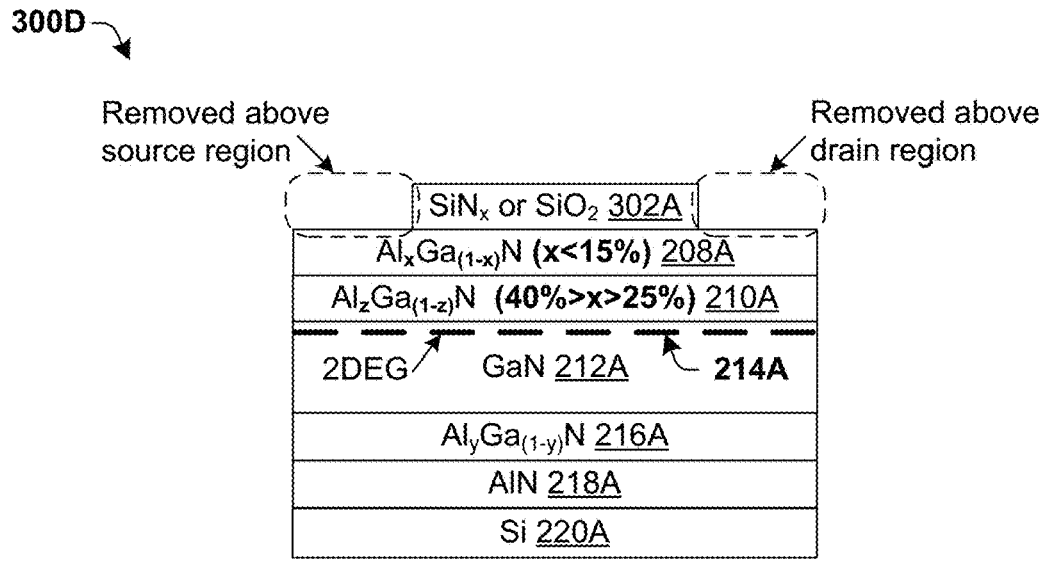
Figure 3E:
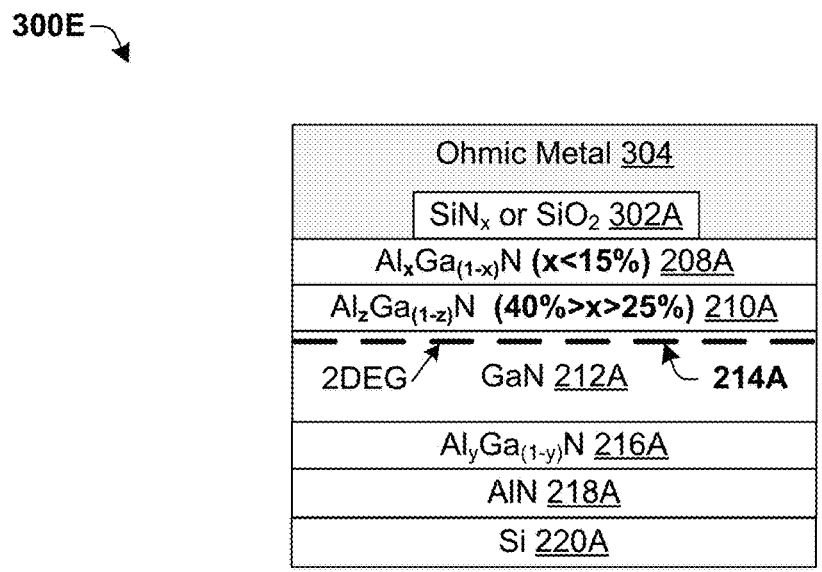
Figure 3F:
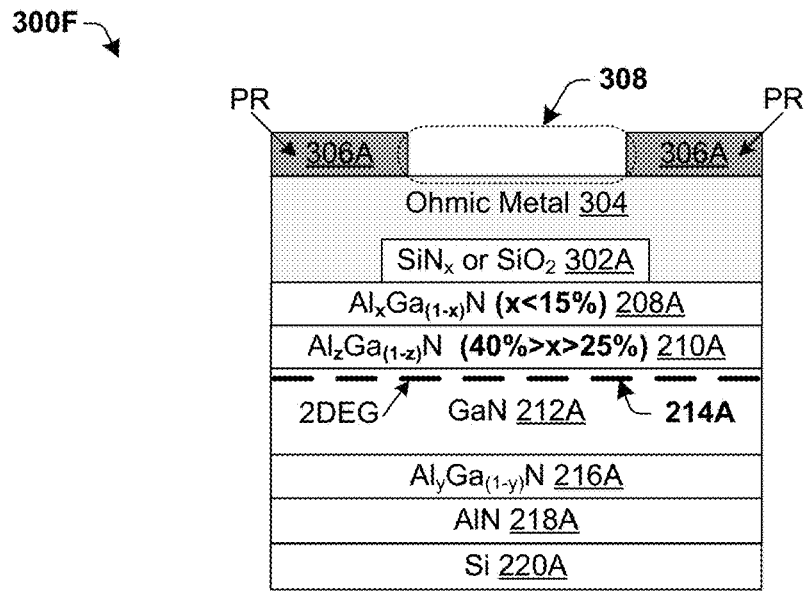
Figure 3G:
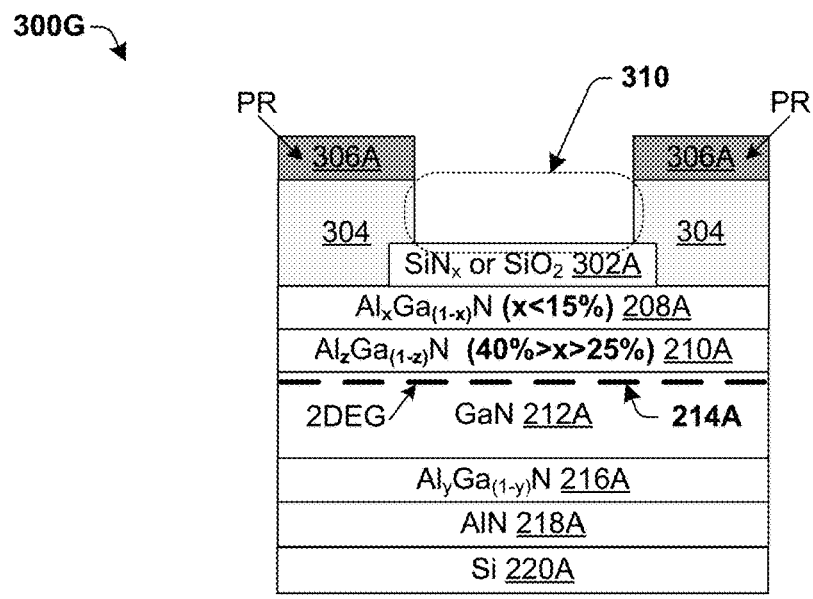
Figure 3H:
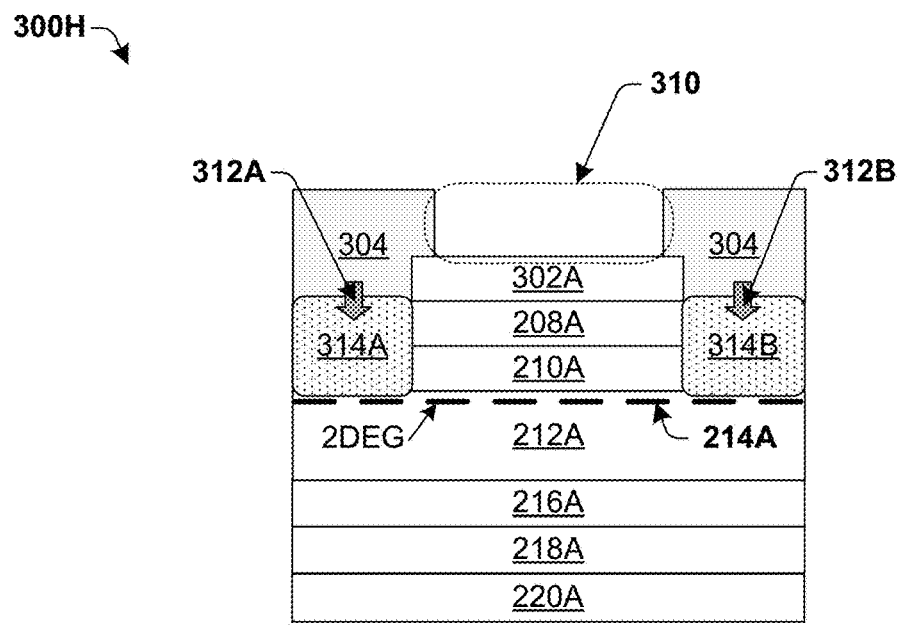
Figure 3I:
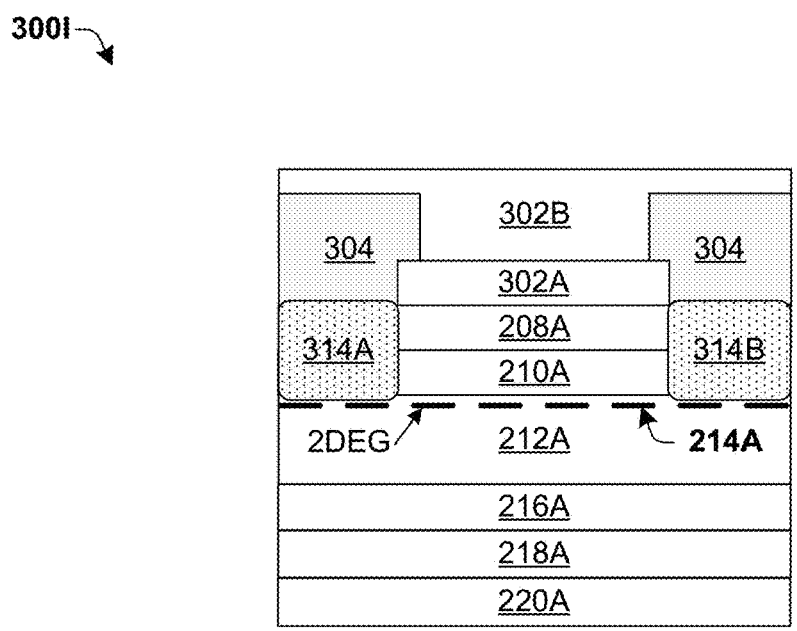
Figure 3J:
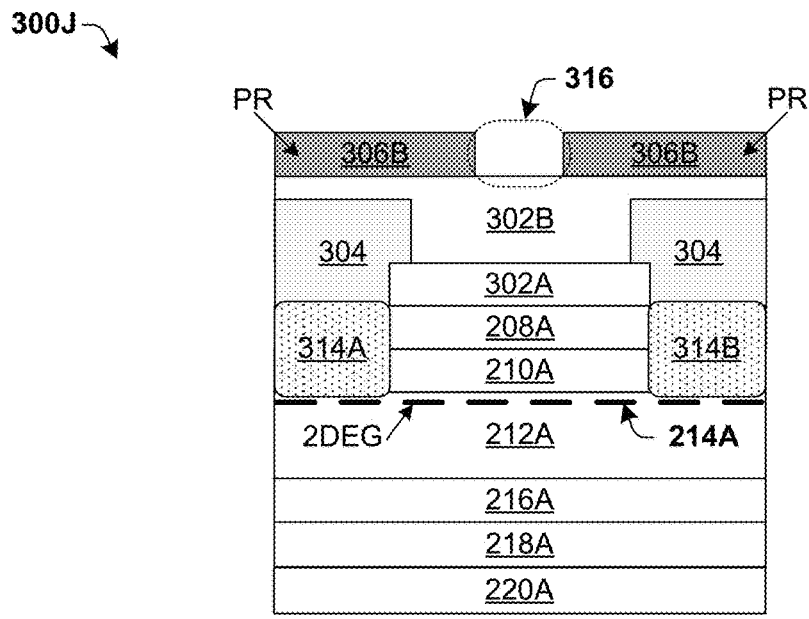
Figure 3K:
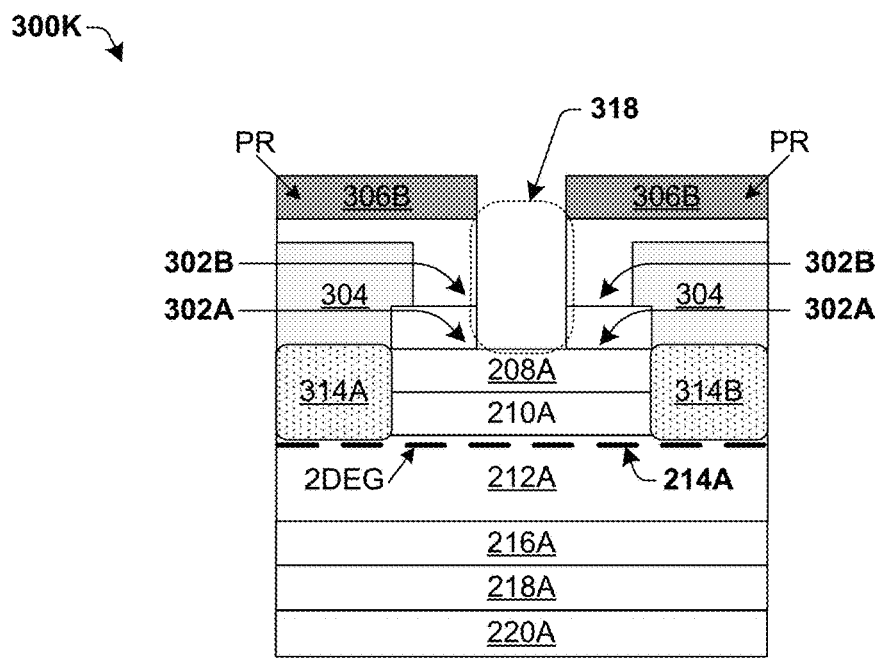
Figure 3L:
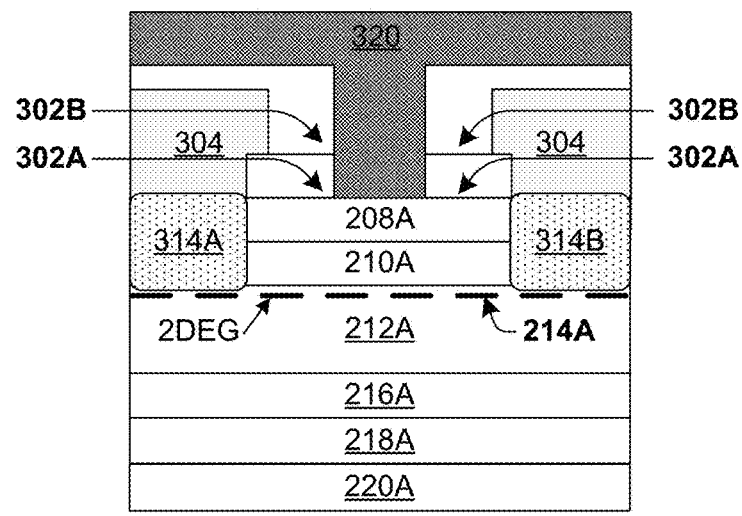
Figure 3M:
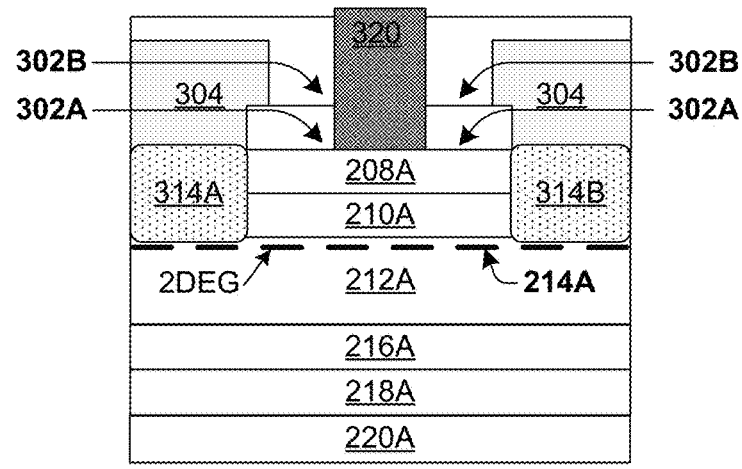
Figure 3N:
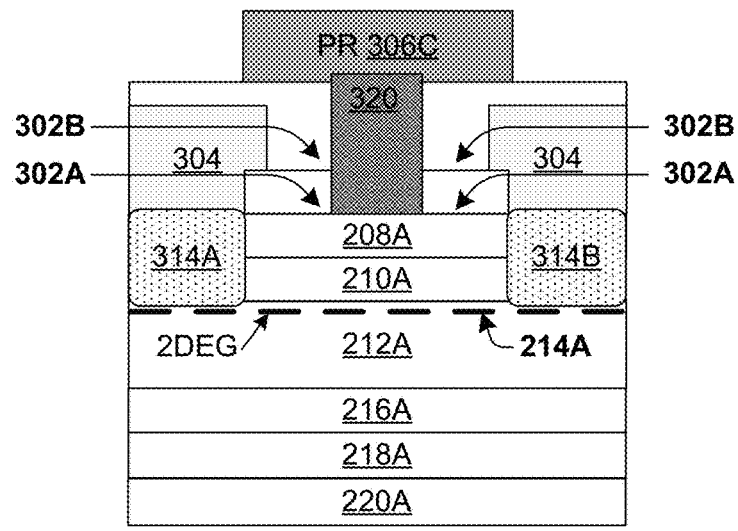
Figure 3O:
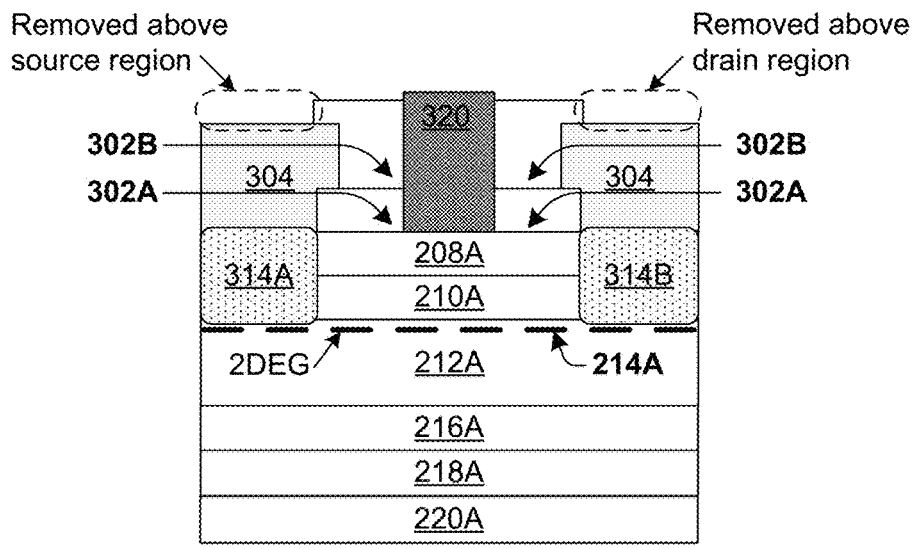

FIGS. 3A-3O illustrate cross-sectional views of some embodiments of a donor layer of bi-layer AlGaN fabrication within a transistor. FIG. 3A illustrates a semiconductor workpiece 300A comprising a Si substrate 220A, a buffer layer 218A of AlN configured to lattice match the Si substrate 220A, a thermal expansion layer 216A of $Al_yGa_{(1-y)}N$ configured with a low coefficient of thermal expansion to achieve structural stability across a range of temperatures, and a channel layer 212A of GaN configured to shield the aforementioned layers from damage due to biasing of a gate (not yet shown). FIG. 3B illustrates a semiconductor workpiece 300B comprising the semiconductor workpiece 300A of FIG. 3A, wherein a donor layer of bi-layer AlGaN has been added. The donor layer of bi-layer AlGaN comprises a mobility-enhancing layer 210A of $Al_zGa_{(1-z)}N$ disposed over the channel layer 212A, wherein a third molar fraction z is less than approximately 0.4 and greater than approximately 0.25, and a resistance-reducing layer 208A of $Al_xGa_{(1-x)}N$ disposed over the mobility-enhancing layer 210A, wherein a first molar fraction x is less than approximately 0.15 and greater than approximately 0.1. FIG. 3C illustrates a semiconductor workpiece 300C comprising the semiconductor workpiece 300B of FIG. 3B, wherein a first isolation layer 302A has been added above the resistance-reducing layer 208A. The first isolation layer 302A comprises $SiN_x$ or $SiO_2$, wherein x is the first molar fraction. FIG. 3D illustrates a semiconductor workpiece 300D comprising the semiconductor workpiece 300C of FIG. 3C, wherein portions of the first isolation layer 302A have been removed above a source region and a drain region. FIG. 3E illustrates a semiconductor workpiece 300E comprising the semiconductor workpiece 300D of FIG. 3D, wherein an ohmic metallization layer 304 has been added above the first isolation layer 302A, source region, and drain region.

FIG. 3F illustrates a semiconductor workpiece 300F comprising the semiconductor workpiece 300E of FIG. 3E, wherein a first layer of photoresist 306A has been disposed above the ohmic metallization layer 304, exposed, and developed through optical lithography to create an first opening 308 in the first layer of photoresist 306A. FIG. 3G illustrates a semiconductor workpiece 300G comprising the semiconductor workpiece 300F of FIG. 3F, wherein the ohmic metallization layer 304 has been etched away beneath the first opening 308 to create a first recess 310 within the ohmic metallization layer 304. FIG. 3H illustrates a semiconductor workpiece 300H comprising the semiconductor workpiece 300G of FIG. 3G, wherein electrons tunnel from the ohmic metallization layer 304 into the $Al_xGa_{(1-x)}N/Al_zGa_{(1-z)}N$ donor bi-layer through a source tunneling junction 312A between the ohmic metallization layer 304 and a source region 314A, and a drain tunneling junction 312B between the ohmic metallization layer 304 and a drain region 314B. Electrons within the $Al_xGa_{(1-x)}N/Al_zGa_{(1-z)}N$ donor bi-layer also diffuse into the channel layer 212A, and accumulate to form the 2DEG 214A. FIG. 3I illustrates a semiconductor workpiece 300I comprising the semiconductor workpiece 300H of FIG. 3H, wherein a second isolation layer 302B been added above the first isolation layer 302A and the ohmic metallization layer 304. The second isolation layer 302B also comprises $SiN_x$ or $SiO_2$, wherein x is the first molar fraction.

FIG. 3J illustrates a semiconductor workpiece 300J comprising the semiconductor workpiece 300I of FIG. 3I, wherein a second layer of photoresist 306B has been disposed above the second isolation layer 302B, exposed, and developed through optical lithography to create an second opening 316 in the second layer of photoresist 306B. FIG. 3K illustrates a semiconductor workpiece 300K comprising the semiconductor workpiece 300J of FIG. 3J, wherein portions of the second isolation layer 302B and the first isolation layer 302A have been etched away beneath the second opening 316 to create a second recess 318 over the channel region. FIG. 3L illustrates a semiconductor workpiece 300L comprising the semiconductor workpiece 300K of FIG. 3K, wherein the second recess 318 has been filled with a gate material 320 which extends over a surface of the second isolation layer 302B. FIG. 3M illustrates a semiconductor workpiece 300M comprising the semiconductor workpiece 300L of FIG. 3L, wherein the gate material 320 over the surface of the second isolation layer 302B has been removed.

FIG. 3N illustrates a semiconductor workpiece 300N comprising the semiconductor workpiece 300M of FIG. 3M, wherein a third layer of photoresist 306C has been disposed, exposed, and developed through optical lithography to remove the third layer of photoresist 306C above the source region 314A and a drain region 314B. FIG. 3O illustrates a semiconductor workpiece 300O comprising the semiconductor workpiece 300N of FIG. 3N, wherein portions of the second isolation layer 302B have been etched away above the source region 314A and a drain region 314B to allow for a contact to the source region 314A and a drain region 314B through the ohmic metallization layer 304, resulting in a HEMT transistor.

Figure 4:
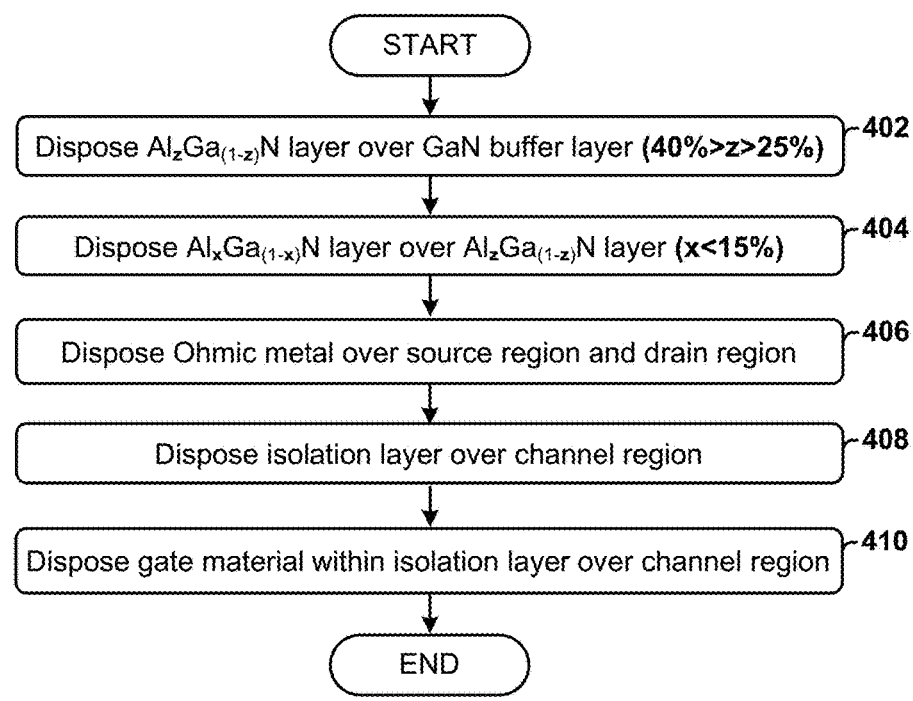
FIG. 4 illustrates some embodiments of a method to form a donor layer of bi-layer AlGaN.
Figure 5:
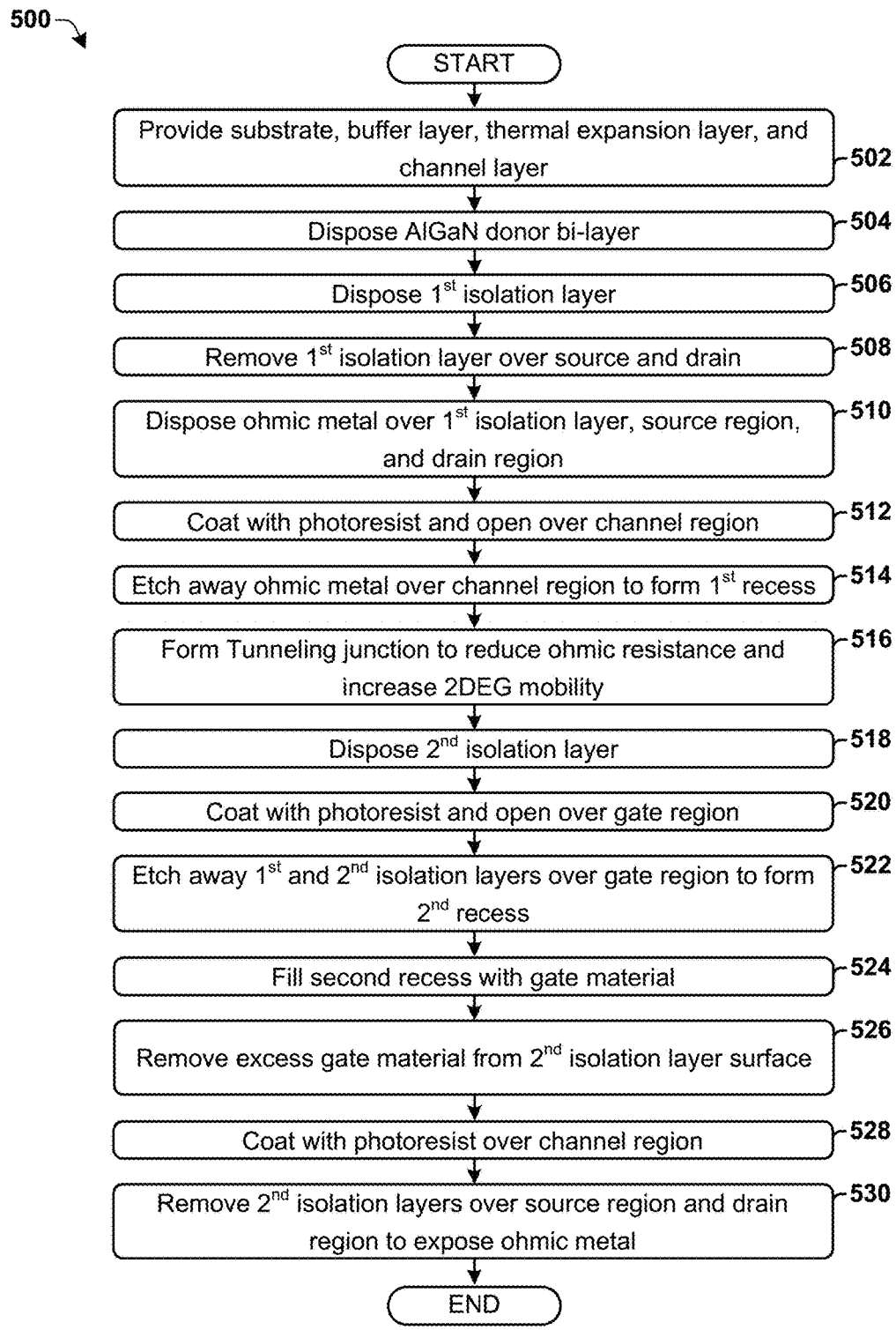
FIG. 5 illustrates some embodiments of a method to form a HEMT comprising a donor layer of bi-layer AlGaN.

FIGS. 4-5 illustrate some embodiments of methods 400 and 500 to form a donor layer of bi-layer AlGaN and a transistor comprising the donor layer of bi-layer AlGaN, respectively. While methods 400 and 500 are illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

FIG. 4 illustrates some embodiments of a method 400 to form a donor layer of bi-layer AlGaN.

At 402, a mobility-enhancing layer of $Al_zGa_{(1-z)}N$ is disposed over a substrate, wherein a third molar fraction z is less than approximately 0.4 and greater than approximately 0.25. In some embodiments, disposal of the mobility-enhancing layer comprises metal organic chemical vapor deposition (MOCVD) or molecular beam epitaxy (MBE).

At 404, a resistance-reducing layer of $Al_xGa_{(1-x)}N$ is disposed over the mobility-enhancing layer, wherein a first molar fraction x is less than approximately 0.15 and greater than approximately 0.1. In some embodiments, disposal of the resistance-reducing layer comprises MOCVD or MBE.

At 406, a source ohmic contact is disposed to connect to the resistance-reducing layer over a source region and a drain ohmic contact is disposed to connect to the resistance-reducing layer over a drain region. In some embodiments, disposal of the source ohmic metal contact and the drain ohmic metal contact comprises sputtering, a thermal coating technique, or electron-bean (e-beam) evaporation of Ti/Al/Ti or Ti/Al/Ti/TiN. A source tunneling junction results at a first interface between the resistance-reducing and the source ohmic metal contact and a drain tunneling junction results at a second interface between the resistance-reducing and the drain ohmic metal contact.

At 408, an isolation layer is disposed over the resistance-reducing layer over a channel region residing between the source region and the drain region. In some embodiments, disposal of the isolation layer comprises low pressure chemical vapor deposition (LPCVD) or plasma enhanced chemical vapor deposition (PECVD).

At 410, a gate material is disposed within the isolation layer over the channel region and contacting the resistance-reducing layer. In some embodiments the gate material comprises TiN or WN. In some embodiments the gate material is disposed with a gate-first or metal inserted poly-silicon (MIPS) fabrication process. In some embodiments the gate material is disposed with a gate-last, or replacement metal gate (RMG) fabrication process.

FIG. 5 illustrates some embodiments of a method 500 to form a HEMT comprising a donor layer of bi-layer AlGaN. Note that the method 500 follows the fabrication flow illustrated in the embodiments of FIGS. 3A-3O.

At 502, a semiconductor workpiece is provided, the semiconductor workpiece comprising a Si substrate, a buffer layer of AlN configured to lattice match the Si substrate, a thermal expansion layer of $Al_yGa_{(1-y)}N$ configured with a low coefficient of thermal expansion to achieve structural stability across a range of temperatures, and a channel layer of GaN configured to shield the aforementioned layers from damage due to biasing of a gate. Layers of the semiconductor workpiece are disposed on the Si substrate through MOCVD or MBE.

At 504, a donor layer of bi-layer AlGaN is disposed on the semiconductor workpiece through MOCVD or MBE. The donor layer of bi-layer AlGaN comprises a mobility-enhancing layer of $Al_zGa_{(1-z)}N$ disposed over the channel layer, wherein a third molar fraction z is less than approximately 0.4 and greater than approximately 0.25, and a resistance-reducing layer of $Al_xGa_{(1-x)}N$ disposed over the mobility-enhancing layer, wherein a first molar fraction x is less than approximately 0.15 and greater than approximately 0.1.

At 506, a first isolation layer comprising $SiN_x$ or $SiO_2$, wherein x is the first molar fraction, is disposed above the resistance-reducing layer through LPVCD or PECVD.

At 508, portions of the first isolation layer are removed above a source region and a drain region through a photomask patterning process comprising optical lithography and subsequent etch step (e.g., a wet etch, dry etch, chemical etch, plasma etch, a combination thereof, etc.).

At 510, an ohmic metallization layer is disposed above the first isolation layer, source region, and drain region through sputtering, a thermal coating technique, an e-beam evaporator, etc.

At 512, a first layer of photoresist is disposed above the ohmic metallization layer through a spin-coating technique. The first layer of photoresist is exposed and developed through optical lithography to create a first opening the first layer of photoresist above a channel region of the HEMT At 514, the ohmic metallization layer is etched away beneath the first opening to create a first recess within the ohmic metallization layer. In some embodiments, etching of the ohmic metallization layer comprises a dry etch.

At 516, electrons tunnel from the ohmic metallization layer into the donor layer of bi-layer AlGaN through a source/drain tunneling junctions 312A between the ohmic metallization layer and a source/drain regions. Electrons within the donor layer of bi-layer AlGaN also diffuse into the channel layer, and accumulate to form the 2DEG which acts as the channel of the HEMT.

At 518, a second isolation layer is disposed above the first isolation layer and the ohmic metallization layer. The second isolation layer also comprises $SiN_x$ or $SiO_2$, wherein x is the first molar fraction, and is disposed through LPVCD or PECVD.

At 520, a second layer of photoresist is spin-coated above the second isolation layer, and exposed and developed through optical lithography to create an second opening in the second layer of photoresist.

At 522, portions of the second isolation layer and the first isolation layer are etched away beneath the second opening to create a second recess over the channel region of the HEMT.

At 524, the second recess is been filled with a gate material which extends over a surface of the second isolation layer. In some embodiments the gate material is disposed with a metal inserted poly-silicon (MIPS) fabrication process. In some embodiments the gate material is disposed with a replacement metal gate (RMG) fabrication process.

At 526, excess gate material is removed over the surface of the second isolation layer through a chemical-mechanical polish (CMP) or a photomask patterning process comprising optical lithography and subsequent etch step (e.g., a wet etch, dry etch, chemical etch, plasma etch, a combination thereof, etc.).

At 528, a third layer of photoresist is spin-coated above the HEMT, patterned, exposed, and developed through optical lithography to remove the third layer of photoresist above the source/drain regions of the HEMT.

At 530, the portions of the second isolation layer are etched away above the source/drain regions to allow for a contact to the source/drain regions through the ohmic metallization layer, resulting in the HEMT transistor 200A of FIG. 2A.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a transistor device having a donor bi-layer configured to provide low-resistance to source and drain contacts while maintaining a high-mobility two-dimensional electron gas within a channel layer, and an associated method of formation.

In some embodiments, the present disclosure relates to a transistor device. The transistor device comprises a channel layer disposed over a substrate and a donor bi-layer disposed over the channel layer. The donor bi-layer comprises a mobility-enhancing layer of $Al_zGa_{(1-z)}N$ disposed over the channel layer and having a first molar fraction z in a first range, and a resistance-reducing layer of $Al_xGa_{(1-x)}N$ disposed on and in contact with the mobility-enhancing layer of $Al_zGa_{(1-z)}N$ and having a second molar fraction x in a second range less than the first range. A source contact and a drain contact are over the resistance-reducing layer of $Al_xGa_{(1-x)}N$. The donor bi-layer has a conduction band energy that monotonically decreases from a top surface of the donor bi-layer to a bottom surface of the donor bi-layer.

In other embodiments, the present disclosure relates a transistor device. The transistor device comprises a layer of gallium nitride (GaN) disposed over a substrate, a mobility-enhancing layer of $Al_zGa_{(1-z)}N$ disposed over the layer of GaN and having a first molar fraction z in a first range, and a resistance-reducing layer of $Al_xGa_{(1-x)}N$ disposed on and in contact with the mobility-enhancing layer of $Al_zGa_{(1-z)}N$ and having a second molar fraction x in a second range less than the first range. A conduction band energy comprises a non-piecewise function extending between a top surface of the resistance-reducing layer of $Al_xGa_{(1-x)}N$ and a bottom surface of the mobility-enhancing layer of $Al_zGa_{(1-z)}N$.

In yet other embodiments, the present disclosure relates to a method of forming a transistor device. The method comprises forming a channel layer over a substrate, and forming a mobility-enhancing layer of $Al_zGa_{(1-z)}N$ on the channel layer using a first single deposition process. The mobility-enhancing layer of $Al_zGa_{(1-z)}N$ has a first molar fraction z in a first range. The method further comprises forming a resistance-reducing layer of $Al_xGa_{(1-x)}N$ on and in contact with the mobility-enhancing layer of $Al_zGa_{(1-z)}N$ using a second single deposition process. The resistance-reducing layer of $Al_xGa_{(1-x)}N$ has a second molar fraction x in a second range less than the first range. The method further comprises forming a source contact and a drain contact onto the resistance-reducing layer of $Al_xGa_{(1-x)}N$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor device, comprising:
   a GaN channel layer disposed over a substrate;
   a donor bi-layer directly contacting the GaN channel layer and comprising:
      a mobility-enhancing layer of $Al_zGa_{(1-z)}N$ disposed over the GaN channel layer and having a first molar fraction z in a first range and a first thickness;
      a resistance-reducing layer of $Al_xGa_{(1-x)}N$ disposed on and in contact with the mobility-enhancing layer of $Al_zGa_{(1-z)}N$ and having a second molar fraction x in a second range that is greater than zero and that is less than the first range and a second thickness that is less than half of the first thickness;
   a source contact and a drain contact over the resistance-reducing layer of $Al_xGa_{(1-x)}N$; and
   wherein the donor bi-layer has a conduction band energy that monotonically decreases from a top surface of the donor bi-layer to a bottom surface of the donor bi-layer, wherein the conduction band energy has a slope that decreases as a distance from the GaN channel layer decreases.

2. The transistor device of claim 1, wherein the substrate consist of silicon.

3. The transistor device of claim 1, further comprising:
   a first dielectric isolation layer continually contacting an upper surface of the resistance-reducing layer of $Al_xGa_{(1-x)}N$ from a first position contacting the source contact to a second position contacting a gate structure contacting the resistance-reducing layer of $Al_xGa_{(1-x)}N$.

4. The transistor device of claim 1, further comprising:
   an aluminum nitride (AlN) buffer layer having a lower surface in contact with the substrate; and
   an AlGaN thermal expansion layer having a lower surface in contact with the AlN buffer layer and having an upper surface in contact with the GaN channel layer, wherein the GaN channel layer is gallium nitride (GaN).

5. The transistor device of claim 1, wherein the resistance-reducing layer of $Al_xGa_{(1-x)}N$ has a substantially planar upper surface extending between the source contact and the drain contact.

6. The transistor device of claim 1, wherein the mobility-enhancing layer of $Al_zGa_{(1-z)}N$ is a single layer of material having consistent electrical properties, which extends between a lower surface contacting the GaN channel layer and an upper surface contacting the resistance-reducing layer of $Al_xGa_{(1-x)}N$.

7. The transistor device of claim 1, wherein the second molar fraction is in a range of between approximately 0.10 and approximately 0.15.

8. The transistor device of claim 1, wherein the first molar fraction is greater than approximately 0.25.

9. The transistor device of claim 1, further comprising:
a gate structure extending through a first dielectric layer contacting an upper surface of the resistance-reducing layer of $Al_xGa_{(1-x)}N$ and laterally surrounded by a second dielectric layer overlying the first dielectric layer.

10. A transistor device, comprising:
a layer of gallium nitride (GaN) disposed over a substrate;
a mobility-enhancing layer of $Al_zGa_{(1-z)}N$ directly contacting the layer of GaN, and having a first molar fraction z in a first range and a first thickness;
a resistance-reducing layer of $Al_xGa_{(1-x)}N$ disposed on and in contact with the mobility-enhancing layer of $Al_zGa_{(1-z)}N$, and having a second molar fraction x in a second range less than the first range and a second thickness that is less than half of the first thickness;
wherein a conduction band energy comprises a non-piecewise function extending between a top surface of the resistance-reducing layer of $Al_xGa_{(1-x)}N$ and a bottom surface of the mobility-enhancing layer of $Al_zGa_{(1-z)}N$;
a first isolation layer arranged over the resistance-reducing layer of $Al_xGa_{(1-x)}N$;
a second isolation layer arranged on and abutting the first isolation layer;
source and drain contacts extending from the resistance-reducing layer of $Al_xGa_{(1-x)}N$ through the first isolation layer, wherein source and drain contacts have upper surfaces recessed below an upper surface of the second isolation layer and lower surfaces abutting upper surfaces of the first isolation layer; and
a gate contact having sidewalls extending from a bottom of the first isolation layer to a top of the second isolation layer, wherein the sidewalls of the gate contact are defined by a continuous function.

11. The transistor device of claim 10, wherein the conduction band energy has a slope between the top surface of the resistance-reducing layer of $Al_xGa_{(1-x)}N$ and the bottom surface of the mobility-enhancing layer of $Al_zGa_{(1-z)}N$ that decreases as a distance from the layer of GaN decreases.

12. The transistor device of claim 10, wherein the conduction band energy monotonically decreases from the top surface of the resistance-reducing layer of $Al_xGa_{(1-x)}N$ to the bottom surface of the mobility-enhancing layer of $Al_zGa_{(1-z)}N$.

13. The transistor device of claim 10, further comprising:
an aluminum nitride (AlN) buffer layer having a lower surface in contact with the substrate; and
an AlGaN thermal expansion layer having a lower surface in contact with the AlN buffer layer and having an upper surface in contact with the layer of GaN.

14. The transistor device of claim 10, wherein the mobility-enhancing layer of $Al_zGa_{(1-z)}N$ is a single layer of material having consistent electrical properties, which extends between a lower surface contacting the layer of GaN and an upper surface contacting the resistance-reducing layer of $Al_xGa_{(1-x)}N$.

15. The transistor device of claim 10,
wherein the second molar fraction is greater than approximately 0.10 and less than approximately 0.15; and
wherein the first molar fraction is greater than approximately 0.25.

16. A method of forming a transistor device, comprising:
forming a channel layer over a substrate;
forming a mobility-enhancing layer of $Al_zGa_{(1-z)}N$ on and in direct contact with the channel layer using a first single deposition process, wherein the mobility-enhancing layer of $Al_zGa_{(1-z)}N$ has a first molar fraction z in a first range and a first thickness;
forming a resistance-reducing layer of $Al_xGa_{(1-x)}N$ on and in contact with the mobility-enhancing layer of $Al_zGa_{(1-z)}N$ using a second single deposition process, wherein the resistance-reducing layer of $Al_xGa_{(1-x)}N$ has a second molar fraction x in a second range less than the first range and a second thickness that is less than half of the first thickness;
forming a first isolation layer over the resistance-reducing layer of $Al_xGa_{(1-x)}N$;
forming a source contact and a drain contact onto the resistance-reducing layer of $Al_xGa_{(1-x)}N$ and extending through the first isolation layer; and
wherein a conduction band energy within the resistance-reducing layer of $Al_xGa_{(1-x)}N$ and the mobility-enhancing layer of $Al_zGa_{(1-z)}N$ comprises a non-piecewise function extending between a top surface of the resistance-reducing layer of $Al_xGa_{(1-x)}N$ and a bottom surface of the mobility-enhancing layer of $Al_zGa_{(1-z)}N$.

17. The method of claim 16, further comprising:
forming a second isolation layer over the first isolation layer after forming the source contact and the drain contact;
selectively etching the first isolation layer and second isolation layer to form an opening continuously extending from a top of the second isolation layer to a bottom of the first isolation layer;
forming a gate contact within the opening after selectively etching the first isolation layer and second isolation layer; and
selectively etching the second isolation layer, after forming the gate contact, to form openings extending though the second isolation layer to the source contact and the drain contact.

18. The method of claim 17, wherein the conduction band energy monotonically decreases from the top surface of the resistance-reducing layer of $Al_xGa_{(1-x)}N$ to the bottom surface of the mobility-enhancing layer of $Al_zGa_{(1-z)}N$.

19. The method of claim 16,
wherein the second molar fraction is greater than approximately 0.10 and less than approximately 0.15; and
wherein the first molar fraction is greater than approximately 0.25.

20. The transistor device of claim 10, wherein the source and drain contacts have uppermost surfaces that are recessed below an uppermost surface of the gate contact.

* * * * *